United States Patent
Yang et al.

(10) Patent No.: US 10,373,558 B2
(45) Date of Patent: Aug. 6, 2019

(54) PIXEL CIRCUIT, A DRIVING METHOD THEREOF AND A DISPLAY APPARATUS

(71) Applicant: BOE TECHNOLOGY GROUP CO., LTD., Beijing (CN)

(72) Inventors: Shengji Yang, Beijing (CN); Xue Dong, Beijing (CN); Jing Lv, Beijing (CN); Xiaochuan Chen, Beijing (CN); Yafeng Yang, Beijing (CN); Wenqing Zhao, Beijing (CN); Can Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/757,297

(22) PCT Filed: Aug. 16, 2017

(86) PCT No.: PCT/CN2017/097645
§ 371 (c)(1),
(2) Date: Mar. 2, 2018

(87) PCT Pub. No.: WO2018/133404
PCT Pub. Date: Jul. 26, 2018

(65) Prior Publication Data
US 2019/0073950 A1    Mar. 7, 2019

(30) Foreign Application Priority Data

Jan. 18, 2017  (CN) .......................... 2017 1 0035131

(51) Int. Cl.
*G09G 3/3233*  (2016.01)
*G09G 3/20*    (2006.01)
(Continued)

(52) U.S. Cl.
CPC .............. *G09G 3/3233* (2013.01); *G09G 3/20* (2013.01); *G09G 3/3266* (2013.01);
(Continued)

(58) Field of Classification Search
CPC ...... G09G 3/3233; G09G 3/3266; G09G 3/20; G09G 2310/062; G09G 2310/0243; H01L 27/3227
See application file for complete search history.

(56) References Cited

U.S. PATENT DOCUMENTS

2010/0220093 A1  9/2010  Choi
2011/0069058 A1  3/2011  Chung et al.
(Continued)

FOREIGN PATENT DOCUMENTS

CN   103700345 A   4/2014
CN   104851392 A   8/2015
(Continued)

OTHER PUBLICATIONS

English Translation of International Search Report & Box V of Written Opinion, for PCT Patent Application No. PCT/CN2017/097645, dated Nov. 16, 2017, 20 pages.

*Primary Examiner* — Abbas I Abdulselam
(74) *Attorney, Agent, or Firm* — Kinney & Lange, P.A.

(57) ABSTRACT

Embodiments of the present disclosure provide a pixel circuit, a driving method thereof and a display apparatus. The pixel circuit comprises a resetting sub-circuit configured to control potentials of the first node, the second node and the third node according to inputting signals of the first signal terminal and the second signal terminal; a charging sub-circuit configured to control a potential of the second node according to an inputting signal of the second signal terminal; a compensating sub-circuit configured to control the potentials of the first node and the third node according (Continued)

to an inputting signal of the third signal terminal and the potential of the second node; a reading sub-circuit is configured to control outputting signals of the first terminal of the light emitting device and the reading terminal according to the inputting signal of the fourth signal terminal.

9 Claims, 8 Drawing Sheets

(51) Int. Cl.
    *G09G 3/3266*     (2016.01)
    *H01L 27/32*     (2006.01)

(52) U.S. Cl.
    CPC . *H01L 27/3227* (2013.01); *G09G 2310/0243* (2013.01); *G09G 2310/062* (2013.01)

(56) References Cited

U.S. PATENT DOCUMENTS

| | | |
|---|---|---|
| 2016/0041676 A1 | 2/2016 | Tan et al. |
| 2016/0225316 A1* | 8/2016 | Chaji .................... G09G 3/3233 |
| 2017/0256200 A1 | 9/2017 | Duan et al. |

FOREIGN PATENT DOCUMENTS

| | | |
|---|---|---|
| CN | 105933623 A | 9/2016 |
| CN | 106782273 A | 5/2017 |

* cited by examiner

PIXEL CIRCUIT, A DRIVING METHOD THEREOF AND A DISPLAY APPARATUS

CROSS-REFERENCE TO RELATED APPLICATION(S)

This application is a Section 371 National Stage Application of International Application No. PCT/CN2017/097645, which claims the benefit of Chinese Patent Application No. 201710035131.7, filed on Jan. 18, 2017, the entire contents of which are incorporated herein by reference.

TECHNICAL FIELD

Embodiment of the present disclosure relates to a field of display technology, and in particular, to a pixel circuit, a driving method thereof, and a display device.

BACKGROUND

A CMOS (Complementary Metal-Oxide Semiconductor) image sensor may receive an external light, convert the light into an electrical signal, and output the electrical signal. As being a detection circuit of a CMOS image sensor, an Active Pixel Sensor (APS) circuit has a non-uniform outputting current during a photoelectric conversion process of a photosensitive device, since the process of the source follower thin film transistors (TFT) may have a difference. Thus, the outputting current of the source follower TFT will be affected by its own threshold voltage, causing a display distortion.

SUMMARY

Embodiments of the present disclosure provide a pixel circuit, a driving method thereof and a display apparatus.

According to an aspect of the embodiments of the disclosure, there is provided a pixel circuit comprising a resetting sub-circuit, a charging sub-circuit, a compensating sub-circuit and a reading sub-circuit, wherein the resetting sub-circuit is connected to a first signal terminal, a first voltage terminal, a second signal terminal, a first node, a second node and a third node, and configured to control potentials of the first node, the second node and the third node according to inputting signals of the first signal terminal and the second signal terminal;

the charging sub-circuit is connected to the second signal terminal and the second node, and configured to control a potential of the second node according to an inputting signal of the second signal terminal;

the compensating sub-circuit is connected to the second node, the first node, the second voltage terminal, the third node, a fourth node, a third voltage terminal, a third signal terminal, a fifth node and a sixth node respectively, and configured to control the potentials of the first node and the third node according to an inputting signal of the third signal terminal and the potential of the second node;

the reading sub-circuit is connected to a first terminal of a light-emitting device which has its second terminal connected to the ground, wherein the reading sub-circuit is connected to the first voltage terminal, the fourth signal terminal, the fourth node, the fifth node, the sixth node and a reading terminal respectively and configured to control outputting signals of the first terminal of the light emitting device and the reading terminal according to the inputting signal of the fourth signal terminal.

For example, the resetting sub-circuit may comprise a first transistor, a second transistor and a third transistor, wherein the first transistor has a gate connected to the first signal terminal, a first electrode connected to the first voltage terminal and a second electrode connected to the second node;

the second transistor has a gate connected to the second signal terminal, a first electrode connected to the ground and a second electrode connected to the first node; and the third transistor has a gate connected to the second signal terminal, a first electrode connected to the ground and a second electrode connected to the third node.

For example, the charging sub-circuit may be connected to a second electrode of a photosensitive device having a first electrode connected to the ground, wherein the photosensitive device comprises a photodiode.

For example, the charging sub-circuit may comprise a fourth transistor and a first capacitor, wherein:

the fourth transistor has a gate connected to the second signal terminal, a first electrode connected to the second electrode of the photosensitive device and a second electrode connected to the second node; and the first capacitor has a first terminal connected to the second node and a second terminal connected to the ground.

For example, the compensating sub-circuit may comprise a fifth transistor, a sixth transistor, a seventh transistor, an eighth transistor, a ninth transistor, a second capacitor and a third capacitor, wherein:

the fifth transistor has a gate connected to the first node, a first electrode connected to the second node and a second electrode connected to the sixth node;

the sixth transistor has a gate connected to the third signal terminal, a first electrode connected to the first node and a second electrode connected to the sixth node;

the seventh transistor has a gate connected to the third signal terminal, a first electrode connected to the third node and a second electrode connected to the fifth node;

the eighth transistor has a gate connected to the third node, a first electrode connected to the fourth node and a second electrode connected to the fifth node;

the ninth transistor has a gate connected to the third signal terminal, a first electrode connected to the fourth node and a second electrode connected to the third voltage terminal;

the second capacitor has a first terminal connected to the first node and a second terminal connected to the second voltage terminal; and the third capacitor has a first terminal connected to the second voltage terminal and a second terminal connected to the third node.

For example, the reading sub-circuit may comprise a tenth transistor, an eleventh transistor and a twelfth transistor;

the tenth transistor has a gate connected to the fourth signal terminal, a first electrode connected to the first voltage terminal and a second electrode connected to the fourth node;

the eleventh transistor has a gate connected to the fourth signal terminal, a first electrode connected to the fifth node and a second electrode connected to the first terminal of the light-emitting device; and the twelfth transistor has a gate connected to the fourth signal terminal, a first electrode connected to the sixth node and a second electrode connected to the reading terminal.

For example, each of the first to twelfth transistors may be an N-type transistor or a P-type transistor.

According to another aspect of the embodiments of the present disclosure, there is provided a display device comprising the pixel circuit of above embodiments.

According to yet another aspect of the embodiments of the present disclosure, there is provided a method of driving the pixel circuit of above embodiments, wherein the first voltage terminal is applied to a voltage at a first level, the second voltage terminal is applied to a common voltage, and the third voltage terminal is applied to a data signal voltage; and the method of driving the pixel circuit comprises:

applying, a second level to the first signal terminal, the second level to the second signal terminal, the first level to the third signal terminal, and the first level to the fourth signal terminal, during a first period;

applying, the first level to the first signal terminal, the second level to the second signal terminal, the first level to the third signal terminal and the first level to the fourth signal terminal, during a second period;

applying, the first level to the first signal terminal, the first level to the second signal terminal, the second level to the third signal terminal and the first level to the fourth signal terminal, during a third period; and applying, the second level to the first signal terminal, the first level to the second signal terminal, the first level to the third signal terminal and the second level to the fourth signal terminal, during a fourth period.

DETAILED DESCRIPTION

In order to make a better understanding of technical solutions in embodiments of the present disclosure for those skilled in the art, a pixel circuit, a driving method thereof and a display apparatus according to the embodiments of the present disclosure are described in detail below with reference to the accompanying drawings.

Figure 1:
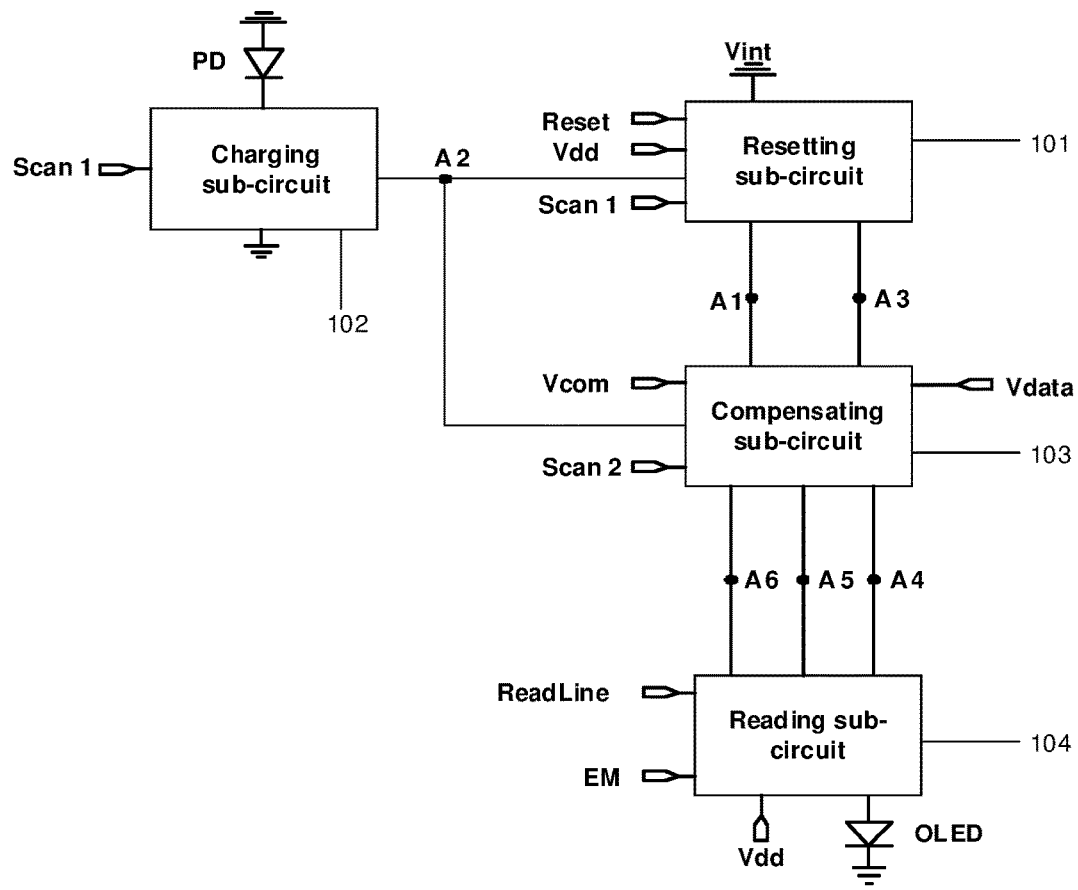
FIG. 1 shows a schematic structural diagram illustrating a pixel circuit according to an embodiment of the present disclosure.

FIG. 1 is a schematic structural diagram illustrating a pixel circuit according to an embodiment of the present disclosure. As shown in FIG. 1, the pixel circuit may comprise a resetting sub-circuit 101, a charging sub-circuit 102, a compensating sub-circuit 103 and a reading sub-circuit 104. The charging sub-circuit 102 of the pixel circuit is connected to a second terminal of a photosensitive device PD whose first terminal is connected to a ground. The reading sub-circuit 104 of the pixel circuit is connected to a first terminal of a light emitting device OLED whose first terminal is connected to a ground.

In one embodiment, the photosensitive device PD comprises a photodiode, and the light emitting device OLED is an organic electroluminescent device.

Referring to FIG. 1, the resetting sub-circuit 101 is connected to a first signal terminal Reset, a first voltage terminal Vdd, a second signal terminal Scan1, a first node A1, a second node A2 and a third node A3 respectively. The resetting sub-circuit 101 may be configured to control potentials of the first node A1, the second node A2 and the third node A3 according to inputting signals of the first signal terminal Reset and the second signal terminal Scan1. The charging sub-circuit 102 is connected to the second signal terminal Scan1 and the second node A2 respectively, and configured to control a potential of the second node A2 according to an inputting signal of the second signal terminal Scan1. The compensating sub-circuit 103 may be connected to the second node A2, the first node A1, the second voltage terminal Vcom, the third node A3, a fourth node A4, a third voltage terminal Vdata, a third signal terminal Scan2, a fifth node A5 and a sixth node A6 respectively, and configured to control the potentials of the first node A1 and the third node A3 according to an inputting signal of the third signal terminal Scan2 and the potential of the second node A2. The reading sub-circuit 104 may be connected to the first voltage terminal Vdd, the fourth signal terminal EM, the fourth node A4, the fifth node A5, the sixth node A6 and a reading terminal ReadLine and configured to control outputting signals of the first terminal of the light emitting device and the reading terminal ReadLine according to the inputting signal of the fourth signal terminal EM.

According to the solutions of the embodiment of the present disclosure, by compensating a source follower transistor in the pixel circuit, a non-uniform outputting current resulted from a difference of the source follower transistors can be avoided, so that the output current is independent of a threshold voltage of the source follower transistor. In addition, according to the solutions of the embodiments of the present disclosure, by sharing a driving signal and a scanning signal, not only a high-resolution silicon-based display function but also a capability for monitoring environmental images can be provided.

Figure 2:
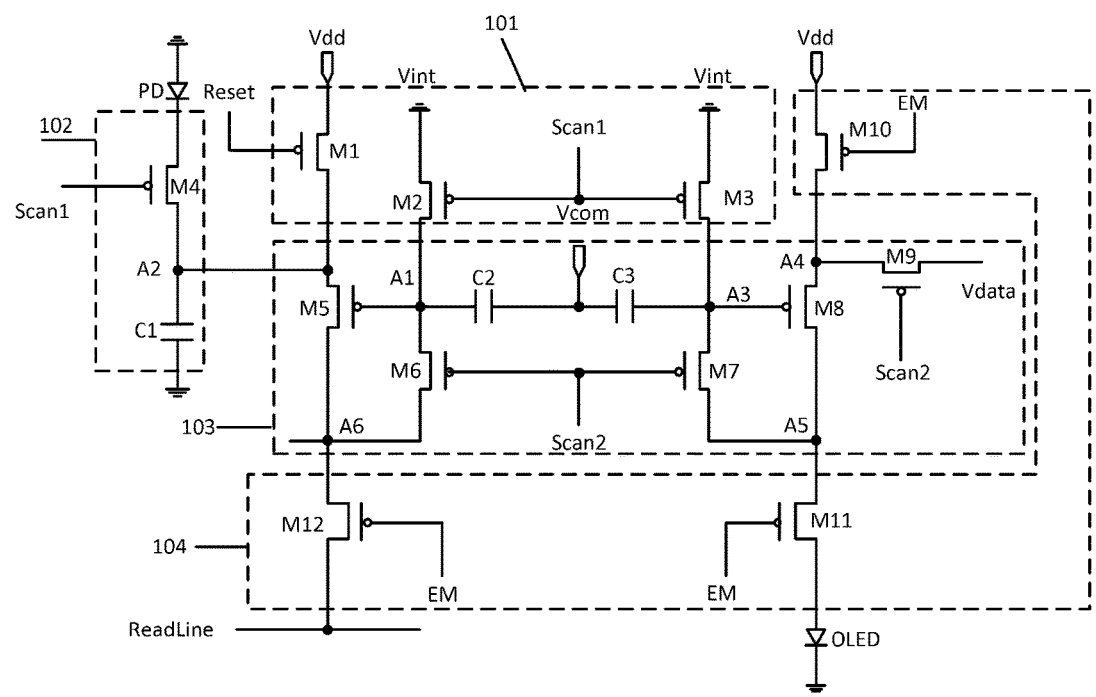
FIG. 2 shows a detailed structural diagram illustrating the pixel circuit shown in FIG. 1.

In one embodiment of the present disclosure, a specific structure of the pixel circuit is provided. FIG. 2 is a detailed structure diagram of the pixel circuit of FIG. 1. As shown in FIG. 2, the resetting sub-circuit 101 comprises a first transistor M1, a second transistor M2 and a third transistor M3. The first transistor M1 has a gate connected to the first signal terminal Reset, a first electrode connected to the first voltage terminal Vdd and a second electrode connected to the second node A2. The second transistor M2 has a gate connected to the second signal terminal Scan1, a first electrode connected to the ground and a second electrode connected to the first node A1. The third transistor M3 has a gate connected to the second signal terminal Scan1, a first electrode connected to the ground and a second electrode connected to the third node A3.

Referring to FIG. 2, the charging sub-circuit 102 comprises a fourth transistor M4 and a first capacitor C1. The fourth transistor M4 has a gate connected to the second signal terminal Scan1, a first electrode connected to the second electrode of the photosensitive device PD and a second electrode connected to the second node A2. The first capacitor C1 has a first terminal connected to the second node A2 and a second terminal connected to the ground.

Referring to FIG. 2, the compensating sub-circuit 103 comprises a fifth transistor M5, a sixth transistor M6, a seventh transistor M7, an eighth transistor M8, a ninth transistor M9, a second capacitor C2 and a third capacitor C3. The fifth transistor M5 has a gate connected to the first node A1, a first electrode connected to the second node A2 and a second electrode connected to the sixth node A6. The sixth transistor M6 has a gate connected to the third signal terminal Scan2, a first electrode connected to the first node A1 and a second electrode connected to the sixth node A6. The seventh transistor M7 has a gate connected to the third signal terminal Scan2, a first electrode connected to the third node A3 and a second electrode connected to the fifth node A5. The eighth transistor M8 has a gate connected to the third node A3, a first electrode connected to the fourth node A4 and a second electrode connected to the fifth node A5. The ninth transistor M9 has a gate connected to the third signal terminal Scan2, a first electrode connected to the fourth node A4 and a second electrode connected to the third voltage terminal Vdata. The second capacitor C2 has a first terminal connected to the first node A1 and a second terminal connected to the second voltage terminal Vcom. The third capacitor has a first terminal connected to the second voltage terminal Vcom and a second terminal connected to the third node A3.

Referring to FIG. 2, the reading sub-circuit 104 comprises a tenth transistor M10, an eleventh transistor M11 and a twelfth transistor M12. The tenth transistor M10 has a gate connected to the fourth signal terminal EM, a first electrode connected to the first voltage terminal Vdd and a second electrode connected to the fourth node A4. The eleventh transistor M11 has a gate connected to the fourth signal terminal EM, a first electrode connected to the fifth node A5 and a second electrode connected to the first terminal of the light-emitting device OLED. The twelfth transistor M12 has a gate connected to the fourth signal terminal EM, a first electrode connected to the sixth node A6 and a second electrode connected to the reading terminal ReadLine.

According to the embodiment of the present disclosure, the first transistor M1, the second transistor M2, the third transistor M3, the fourth transistor M4 and the sixth transistor M6 are switching transistor TFTs, and the fifth transistor M5 is a source follower transistor. Similarly, seventh transistor M7, the ninth transistor M9, the tenth transistor M10, the eleventh transistor M11 and the twelfth transistor M12 are switching transistor TFTs, and the eighth transistor M8s is a driving transistor TFT.

The switching transistors, the driving transistor and the source follower driving transistor used in the embodiments of the present disclosure may be thin film transistors, such as oxide semiconductor transistors. Since the source and the drain of the thin film transistor used herein are symmetrical, the source and the drain of the thin film transistor can be exchanged. In an embodiment of the present disclosure, one of the source and the drain is referred to as the first electrode, and the other is referred to as the second electrode. For the convenience of description, all of the thin film transistors in the following examples are P-type thin film transistors, with a gate-on voltage of a low level. It should be understood for those skilled in the art that the thin film transistor may also be an N-type thin film transistor, and in this case, the polarity of the gate controlling signal should be changed accordingly.

According to another aspect of embodiments of the present disclosure, there is provided a display apparatus including the pixel circuit according to the embodiment of the present disclosure.

In the display device according to the embodiment of the present disclosure, the pixel circuit may include a resetting sub-circuit, a charging sub-circuit, a compensating sub-circuit, a reading sub-circuit and a light emitting device. The resetting sub-circuit is configured to control potentials of the first node, the second node and the third node according to inputting signals of the first signal terminal and the second signal terminal. The charging sub-circuit is configured to control a potential of the second node according to an inputting signal of the second signal terminal. The compensating sub-circuit is configured to control the potentials of the first node and the third node according to an inputting signal of the third signal terminal and the potential of the second node. The reading sub-circuit is configured to control outputting signals of the first terminal of the light emitting device and the reading terminal according to the inputting signal of the fourth signal terminal.

Figure 3:
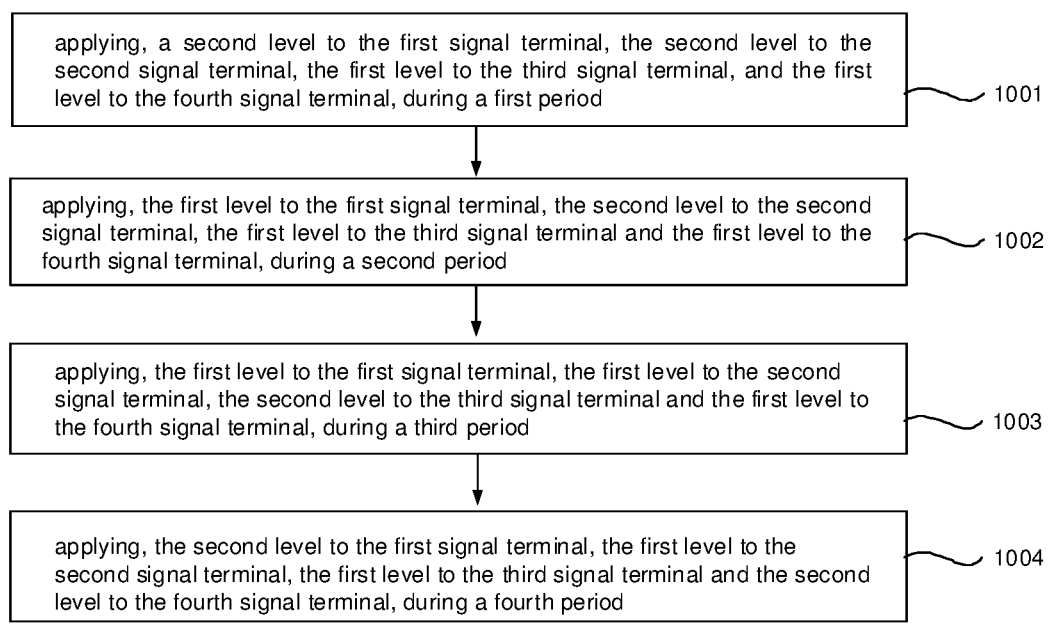
FIG. 3 shows a flowchart illustrating a driving method for the pixel circuit according to an embodiment of the present disclosure.
Figure 4:
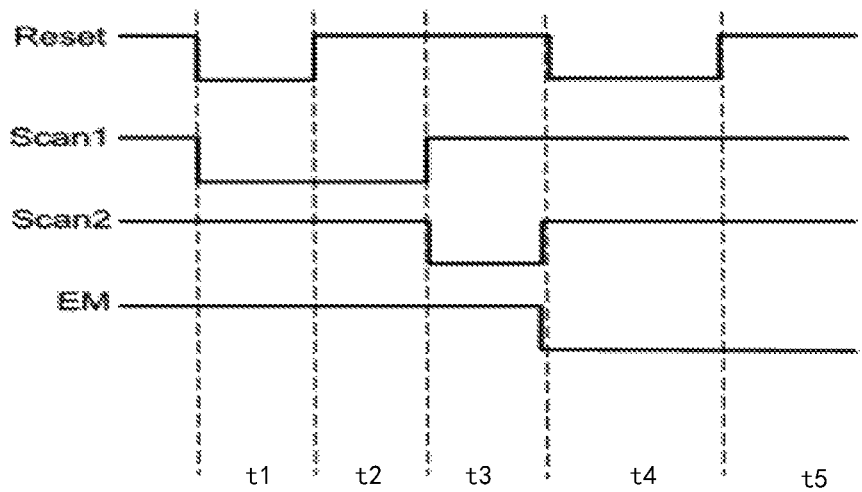
FIG. 4 shows an operation timing diagram of the pixel circuit according to an embodiment of the present disclosure.

FIG. 3 is a flowchart illustrating a driving method for the pixel circuit according to an embodiment of the present disclosure. FIG. 4 shows an operation timing diagram of the pixel circuit according to an embodiment of the present disclosure. In the examples of FIG. 3 and FIG. 4, the first voltage terminal Vdd is applied to a voltage at a high level, the second voltage terminal Vcom is applied to a common voltage, and the third voltage terminal Vdata is applied to a data signal voltage. In the following example, all of the transistors M1 to M12 are P-type transistors with a gate-on voltage of a low level. It should be understood by those skilled in the art that the transistors may also be an N-type transistors, in which case the gate-on voltage is at a high level.

The driving method of the pixel circuit according to the embodiment of the present disclosure may include following steps.

At step 1001, during the first period t1, the input signal of the first signal terminal is at a low level, the input signal of the second signal terminal is at a low level, the input signal of the third signal terminal is at a high level, and the input signal of the fourth signal terminal is at a high level.

Figure 5:
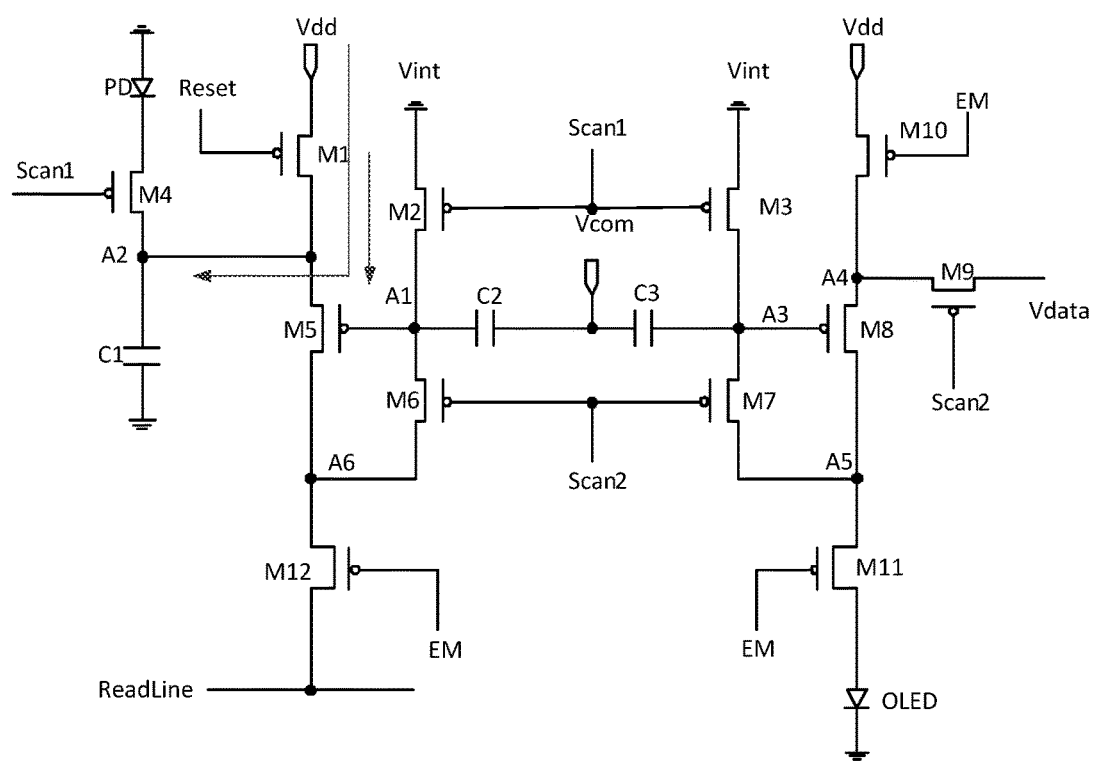
FIG. 5 shows a schematic diagram of the current flow of the pixel circuit during the first period according to the driving method of FIG. 3.

FIG. 5 is a schematic diagram of the current flow of the pixel circuit during the first period t1 according to the embodiment of FIG. 3. As shown in FIG. 5, the first period t1 is a resetting period, and the direction of the arrow in the figure represents the current flow. During the first period t1, the input signal of the first signal terminal Reset is at low level, the input signal of the second signal terminal Scan1 is at low level, the input signal of the third signal terminal Scan2 is at a high level, and the input signal of the fourth signal terminal EM is at a high level. At this time, the first transistor M1, the second transistor M2 and the fourth transistor M4 are turned on, and the other transistors are turned off. In this case, the potential of the first node A1 is reset to Vint, for example, 0V. The second node A2 has a potential of Vdd, and the potential of the third node A3 is reset to 0V. Meanwhile, the previous voltage signal has been reset.

At step 1002, during the second period t2, the input signal of the first signal terminal is at a high level, the input signal of the second signal terminal is at a low level, the input signal of the third signal terminal is at a high level, and the input signal of the fourth signal terminal is at a high level.

Figure 6:
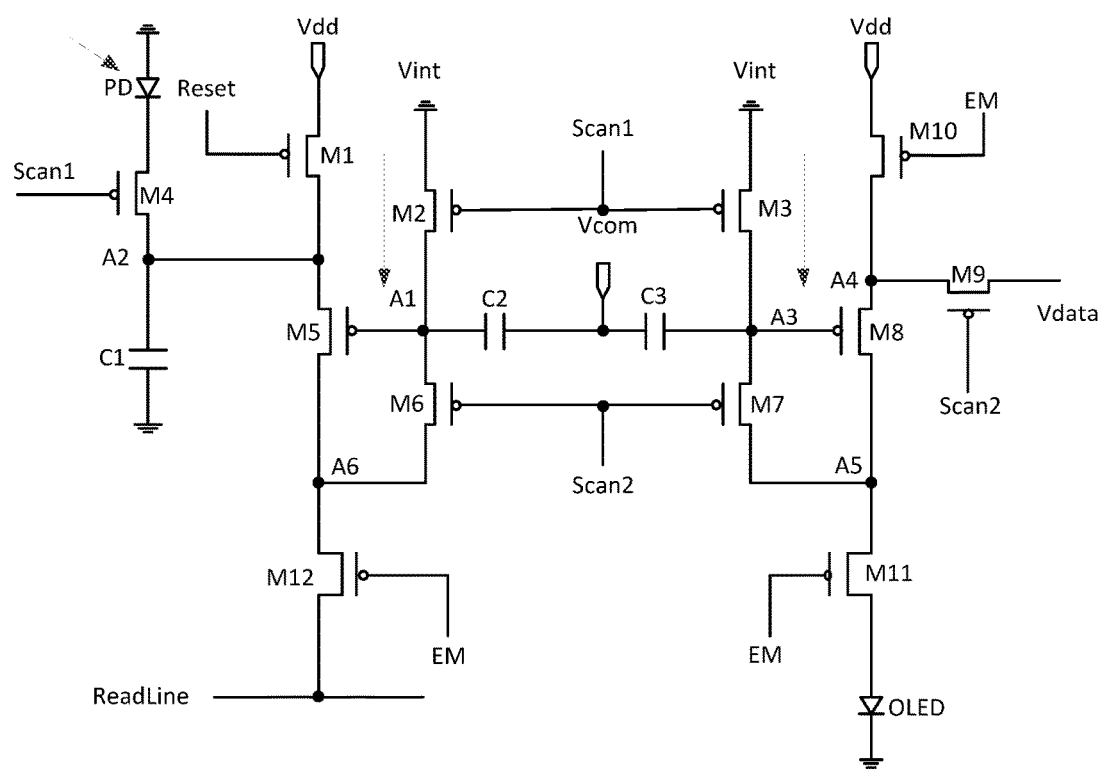
FIG. 6 shows a schematic diagram of the current flow of the pixel circuit during the second period according to the driving method of FIG. 3.

FIG. 6 is a schematic diagram of the current flow of the pixel circuit during the second period t2 according to the embodiment of FIG. 3. As shown in FIG. 6, the second period t2 is a photosensitivity accumulation period, and an arrow on the photosensitive device PD indicates for a photoelectrical reaction. During the second period t2, the input signal of the first signal terminal Reset is at a high level, the input signal of the second signal terminal Scan1 is at a low level, the input signal of the third signal terminal Scan2 is at a high level, and the input signal of the fourth signal terminal EM is at a high level. At this time, only the fourth transistor M4 is turned on and the other transistors are turned off. When a light is incident on a diode PN junction of the photosensitive device PD, the photon quantum excitation generates an electron-hole pair on the PN junction, so that the charge on a capacitor of the PN junction is recombined, thereby reducing the potential of the second node A2 to Vdata1, where Vdata1 is directly generated by the irradiation on the diode PN junction. In this embodiment, Vdata1 is stored at both ends of the first capacitor C1, so as to be ready for a compensating period.

At step 1003, in the third period t3, the input signal of the first signal terminal is at a high level, the input signal of the second signal terminal is at a high level, the input signal of the third signal terminal is at a low level, and the input signal of the fourth signal terminal is at a high level.

Figure 7:
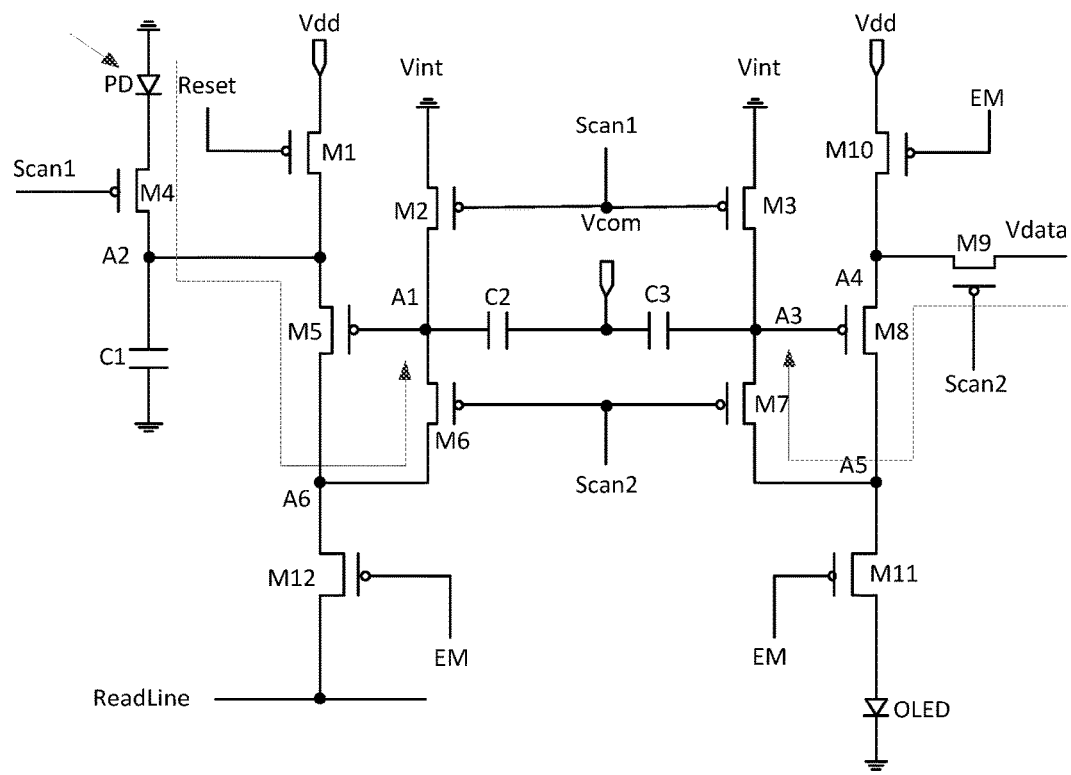
FIG. 7 shows a schematic diagram of the current flow of the pixel circuit during the third period according to the driving method of FIG. 3.

FIG. 7 is a schematic diagram of the current flow of the pixel circuit during the third period t3 according to the embodiment of FIG. 3. As shown in FIG. 7, the third period t3 is a compensating period, and the direction of the arrow in the figure represents the current flow. During the third period t3, the input signal of the first signal terminal Reset is at a high level, the input signal of the second signal terminal Scan1 is at a high level, the input signal of the third signal terminal Scan2 is at a low level, and the input signal of the fourth signal terminal EM is at a high level. At this time, the fourth transistor M4, the fifth transistor M5 and the sixth transistor M6 are turned on, while the first transistor M1, the second transistor M2 and the twelfth transistor M12 are turned off. Since the ground potential of the first node A1 is 0V previously, the source follower transistor M5 is turned on, and the current flows to the sixth transistor M6 via the fourth transistor M4 and the fifth transistor M5, so as to start charging the first node A1 until the first node A1 is charged to Vdata1−Vmth. At this time, the voltage difference between the gate and the source of the fifth transistor M5 is Vmth. After the charging is completed, the potential of the first node A1 will always be maintained at Vdata1−Vmth. Similarly, in this embodiment, the third voltage terminal Vdata compensates the eighth transistor M8 so as to maintain the potential of the third node A3 to Vdata2−Vnth. At this time, the voltage difference between the gate and the source of the eighth transistor M8 is Vnth.

At step 1004, during the fourth period t4, the input signal of the first signal terminal is at a low level, the input signal of the second signal terminal is at a high level, the input signal of the third signal terminal is at a high level, and the input signal of the fourth signal terminal is at a low level.

Figure 8:
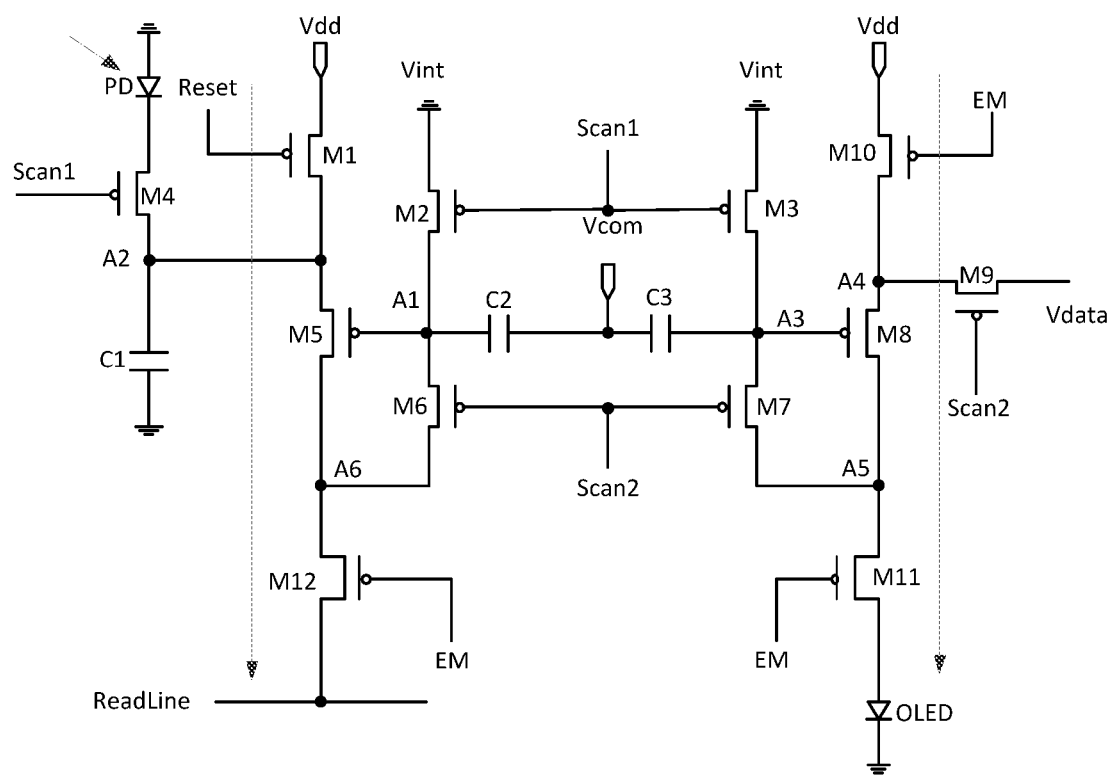
FIG. 8 shows a schematic diagram of the current flow of the pixel circuit during the fourth period according to the driving method of FIG. 3.

FIG. 8 is a schematic diagram of the current flow of the pixel circuit during the third period t3 according to the embodiment of FIG. 3. As shown in FIG. 8, the fourth period t4 is a compensating period, and the direction of the arrow in the figure represents the current flow. During the fourth period t4, the input signal of the first signal terminal Reset is at low level, the input signal of the second signal terminal Scan1 is at high level, the input signal of the third signal terminal Scan2 is at a high level, and the input signal of the fourth signal terminal EM is at a low level. At this time, the source of the fifth transistor M5 is connected to the voltage terminal Vdd. The potential of the second node A2 is Vdd. The current flows through the first transistor M1 and the fifth transistor M5 to the sixth transistor M6, and then is output by the read terminal Readline. It can be derived by an equation for the transistor saturation current as follows:

$$I = K_1(Vgs-Vmth)^2 = K_1[Vdd-(Vdata1-Vmth)-Vmth]^2 = K_1(Vdd-Vdata1)^2$$

wherein $K_1$ is the current coefficient of the fifth transistor M5. It can be seen from the above equation that the operation current I is independent from the threshold voltage Vmth of the source follower transistor at this time, but only related with Vdd and Vdata1. Vdata1 is directly generated by the irradiation on the diode PN junction, avoiding a drift of the threshold voltage Vmth of source follower transistors, and ensuring an accuracy of the signal data.

Similarly, a light emitting current $I_{oled}=K_2(Vdd-Vdata2)^2$ can be derived, where $K_2$ is the current coefficient of the driving transistor M8. At this time, the light-emitting current $I_{oled}$ is independent from the threshold voltage Vnth of the driving transistor M8, but only relates to the data signal voltage Vdata2 which is compensated for the driving transistor M8 by the third voltage terminal. Therefore, the drift of the threshold voltage Vnth of the driving transistors can be avoided, so that the threshold voltage Vnth does not affect the light emitting current $I_{oled}$, thereby ensuring the normal operation of the organic electroluminescent device.

According to the driving method of the pixel circuit according to the embodiment of the present disclosure, the resetting sub-circuit is configured to control potentials of the first node, the second node and the third node according to inputting signals of the first signal terminal and the second signal terminal. The charging sub-circuit is configured to control a potential of the second node according to an inputting signal of the second signal terminal. The compensating sub-circuit is configured to control the potentials of the first node and the third node according to an inputting signal of the third signal terminal and the potential of the second node. The reading sub-circuit is configured to control outputting signals of the first terminal of the light emitting device and the reading terminal according to the inputting signal of the fourth signal terminal. The technical solution according to this embodiment compensates for the source follower transistor of the pixel circuit to avoid a non-uniform outputting current caused by the difference of the source follower transistors itself, so that the outputting current is independent from the threshold voltage of the source follower transistor. In addition, by sharing the driving signal and the scanning signal, the embodiments of the present disclosure can not only realize the high-resolution silicon-based display function but also have a function of monitoring environment image.

It can be understood that the above embodiments are merely exemplary embodiments used for illustrating the principle of the embodiments of the present disclosure, but the embodiments of the present disclosure are not limited thereto. For those skilled in the art, various variations and improvements may be made without departing from the spirit and essence of the embodiments of the present disclosure, and these variations and improvements are also considered as the scope of the embodiments of the present disclosure.

We claim:
1. A pixel circuit, comprising:
   a resetting sub-circuit, connected to a first signal terminal, a first voltage terminal, a second signal terminal, a first node, a second node and a third node, and configured to control potentials of the first node, the second node and the third node according to inputting signals of the first signal terminal and the second signal terminal;

a charging sub-circuit, connected to the second signal terminal and the second node, and configured to control a potential of the second node according to an inputting signal of the second signal terminal;

a compensating sub-circuit, connected to the second node, the first node, the second voltage terminal, the third node, a fourth node, a third voltage terminal, a third signal terminal, a fifth node and a sixth node, and configured to control the potentials of the first node and the third node according to an inputting signal of the third signal terminal and the potential of the second node;

a reading sub-circuit, connected to a first terminal of a light-emitting device which has its second terminal connected to the ground, wherein the reading sub-circuit is connected to the first voltage terminal, the fourth signal terminal, the fourth node, the fifth node, the sixth node and a reading terminal and configured to control outputting signals of the first terminal of the light emitting device and the reading terminal according to the inputting signal of the fourth signal terminal.

2. The pixel circuit of claim 1, wherein the resetting sub-circuit comprises a first transistor, a second transistor and a third transistor;

the first transistor has a gate connected to the first signal terminal, a first electrode connected to the first voltage terminal and a second electrode connected to the second node;

the second transistor has a gate connected to the second signal terminal, a first electrode connected to the ground and a second electrode connected to the first node; and the third transistor has a gate connected to the second signal terminal, a first electrode connected to the ground and a second electrode connected to the third node.

3. The pixel circuit of claim 2, wherein each of the first to twelfth transistors is an N-type transistor or a P-type transistor.

4. The pixel circuit of claim 1, wherein the charging sub-circuit is connected to a second electrode of a photosensitive device having a first electrode connected to the ground, wherein the photosensitive device comprises a photodiode.

5. The pixel circuit of claim 1, wherein the charging sub-circuit comprises fourth transistor and a first capacitor, wherein:

the fourth transistor has a gate connected to the second signal terminal, a first electrode connected to the second electrode of the photosensitive device and a second electrode connected to the second node; and the first capacitor has a first terminal connected to the second node and a second terminal connected to the ground.

6. The pixel circuit of claim 1, wherein the compensating sub-circuit comprises a fifth transistor, a sixth transistor, a seventh transistor, an eighth transistor, a ninth transistor, a second capacitor and a third capacitor, wherein:

the fifth transistor has a gate connected to the first node, a first electrode connected to the second node and a second electrode connected to the sixth node;

the sixth transistor has a gate connected to the third signal terminal, a first electrode connected to the first node and a second electrode connected to the sixth node;

the seventh transistor has a gate connected to the third signal terminal, a first electrode connected to the third node and a second electrode connected to the fifth node;

the eighth transistor has a gate connected to the third node, a first electrode connected to the fourth node and a second electrode connected to the fifth node;

the ninth transistor has a gate connected to the third signal terminal, a first electrode connected to the fourth node and a second electrode connected to the third voltage terminal;

the second capacitor has a first terminal connected to the first node and a second terminal connected to the second voltage terminal; and the third capacitor has a first terminal connected to the second voltage terminal and a second terminal connected to the third node.

7. The pixel circuit of claim 1, wherein the reading sub-circuit comprises a tenth transistor, an eleventh transistor and a twelfth transistor;

the tenth transistor has a gate connected to the fourth signal terminal, a first electrode connected to the first voltage terminal and a second electrode connected to the fourth node;

the eleventh transistor has a gate connected to the fourth signal terminal, a first electrode connected to the fifth node and a second electrode connected to the first terminal of the light-emitting device; and the twelfth transistor has a gate connected to the fourth signal terminal, a first electrode connected to the sixth node and a second electrode connected to the reading terminal.

8. A display device comprising the pixel circuit according to claim 1.

9. A method of driving the pixel circuit according to claim 1, wherein the first voltage terminal is applied to a voltage at a first level, the second voltage terminal is applied to a common voltage, and the third voltage terminal is applied to a data signal voltage; and the method of driving the pixel circuit comprises:

applying, a second level to the first signal terminal, the second level to the second signal terminal, the first level to the third signal terminal, and the first level to the fourth signal terminal, during a first period;

applying, the first level to the first signal terminal, the second level to the second signal terminal, the first level to the third signal terminal and the first level to the fourth signal terminal, during a second period;

applying, the first level to the first signal terminal, the first level to the second signal terminal, the second level to the third signal terminal and the first level to the fourth signal terminal, during a third period; and applying, the second level to the first signal terminal, the first level to the second signal terminal, the first level to the third signal terminal and the second level to the fourth signal terminal, during a fourth period.

* * * * *